Aug. 22, 1967 S. Y. HUSNI 3,336,658
SUPERCONDUCTIVE ARTICLES
Filed Dec. 6, 1963
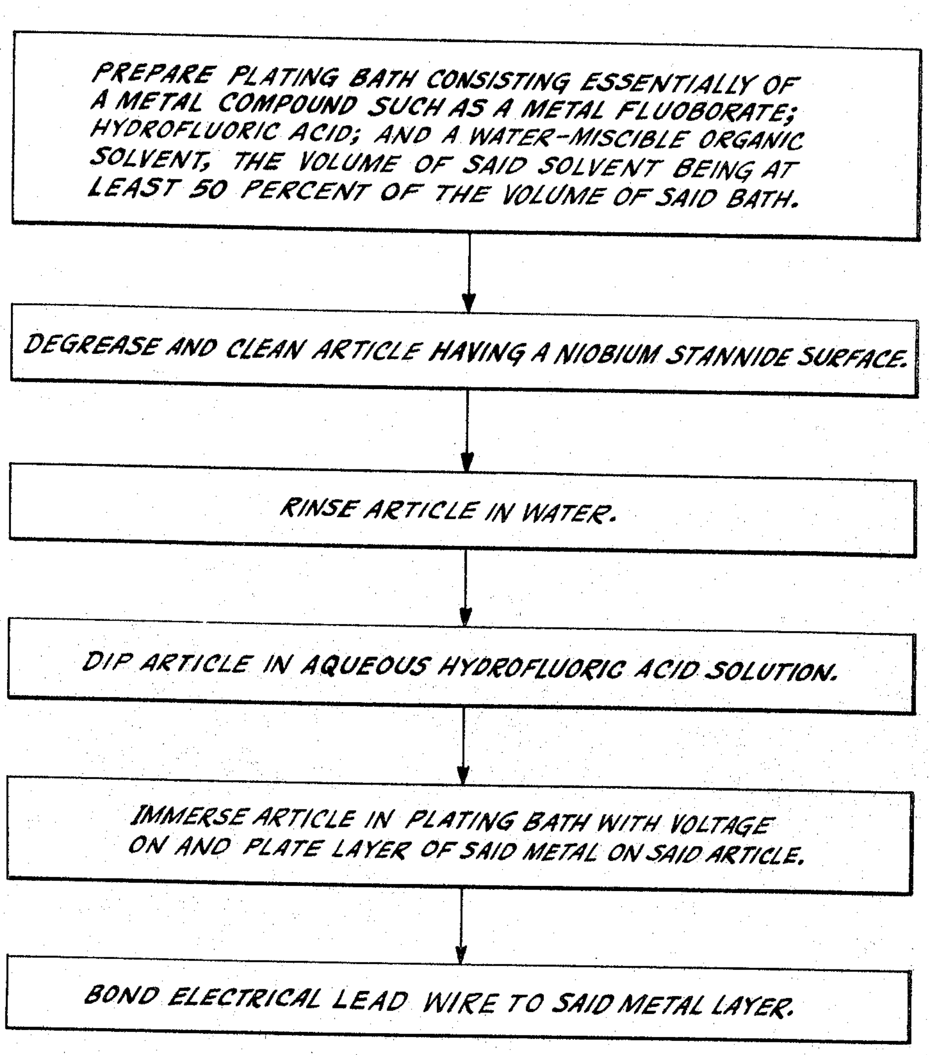
INVENTOR.
SALEEM Y. HUSNI
BY
W.S. Hill
AGENT United States Patent Office 3,336,658

Patented Aug. 22, 1967

3,336,658
SUPERCONDUCTIVE ARTICLES

Saleem Y. Husni, Westwood, N.J., assignor to Radio Corporation of America, a corporation of Delaware Filed Dec. 6, 1963, Ser. No. 328,697
2 Claims. (Cl. 29—492)

This invention relates to improved methods of making electrical connections to articles having a niobium stannide surface, by plating a metallic film thereupon.

Articles such as ribbons, wires, cylinders and the like consisting or superconductors such as nobium stannide, or having a niobium stannide surface, are useful for conducting large currents at cryogenic temperatures, and for shields against magnetic flux. See, for example, Kunzler and Tannenbaum, "Superconductive Magnets," Scientific American, June 1962, pages 60–67.

To exploit the superconductive properties of such niobium stannide articles, it is often desired to attach electrical connections thereto. The direct bonding or soldering of an electrical lead wire to a niobium stannide surface is unsatisfactory, since the bonds thus formed are mechanically weak. Attempts have been made to deposit metallic films on bodies having a niobium stannide surface by electroplating the body in an aqueous plating bath, and then bonding an electrical lead wire to the aforesaid metal film. However, such films have hitherto exhibited poor adherence to the niobium stannide surface. When an electrical lead wire is bonded to such metal films of the prior art, the wire adheres to the metal film, but under stress the film pulls away from the niobium stannide surface.

Accordingly, it is an object of this invention to provide an improved method of forming electrical connections to articles having a niobium stannide surface.

Another object is to provide an improved method of depositing an adherent metallic film on an article having a niobium stannide surface.

These and other objects of the invention are accomplished by a method of depositing an adherent metallic film on an article having a niobium stannide surface comprising the steps of plating said article in a plating bath consisting essentially of a metal compound such as a metal salt, an inorganic acid such as hydrofluoric acid, and a water-miscible organic solvent. The volume of the organic solvent present is at least 50 percent of the volume of the plating bath. An electrical lead wire is subsequently bonded to the adherent metal film thus formed on the surface of the article.

The invention and its features will be described in greater detail by the following examples, in conjunction with the accompanying drawing, in which the single figure is a flow sheet of the method of the invention.

*Example I*

A plating bath is prepared comprising three principal ingredients: an inorganic acid such as hydrofluoric acid; a compound of a metal selected from the group consisting of iron, cobalt and nickel; and a water-miscible organic solvent. The volume of the organic solvent in the bath is at least equal to one-half the volume of the bath.

In this example, the metal ions in the plating bath are nickel ions, and are obtained by preparing an aqueous solution of a water-soluble nickel compound. Nickel fluoborate is a suitable water-soluble nickel salt for this purpose. Conveniently, a concentrated aqueous solution of the metal salt is prepared, and the volumetric ratio of metal salt solution, acid solution, and organic solvent is adjusted so that the concentration of metal ions in the bath is fixed at some value between about ⅓ to 1½ mols per liter. In this example, a concentrated aqueous solution of nickel fluoborate containing 48 weight percent nickel fluoborate is prepared.

The aqueous inorganic acid solution is preferably hydrofluoric acid. Conveniently, a concentrated aqueous solution of hydrofluoric acid is prepared, and the volumetric ratio of salt solution, acid solution, and organic solvent is adjusted so that the concentration of hydrofluoric acid in the bath is fixed at some value between about 2 to 4½ mols per liter.

The water-miscible organic solvent is selected from the group of oxygen-containing water-miscible compounds such as ethylene glycol, diethylene glycol, glycerine, NN dimethyl formamide, Cellosolve (ethanol, 2-ethoxy-glycol monoethyl ether), methyl Cellosolve (ethanol, 2-methoxy-glycol monomethyl ether), butyl Cellosolve (ethanol, 2-butoxy-glycol monobutyl ether), diethylene glycol monomethyl ether, methanol, ethanol, propanol, isopropanol, and the like. The amount of the organic solvent in the bath solution may vary between at least 50 volume percent and 100 volume percent. The fraction of the plating bath solvent which is not an organic solvent in water.

In this embodiment, the bath is prepared by mixing 15 volumes of the concentrated aqueous nickel fluoborate solution with 10 volumes of the concentrated aqueous hydrofluoric acid solution, then adding 105 volumes of one of the oxygen-containing water-miscible organic solvents mentioned above, which in this example, consists of ethanol, 2-ethoxy-glycol monoethyl ether (commonly known as Cellosolve). The bath thus prepared contains about 2 mol hydrofluoric acid per liter, about ⅓ mol nickel ions per liter, and more than 50 percent by volume of the organic solvent.

The niobium stannide article, which may, for example be a ceramic cylinder coated with niobium stannide, or a platinum ribbon coated with niobium stannide, is first degreased and cleaned by conventional methods, then rinsed in water. The article is next dipped in a strong aqueous solution of hydrofluoric acid, then taken directly from the dip and immersed in the plating bath. The temperature of the plating bath is suitably about 20° C. to 60° C. Preferably, the article is immersed in the plating bath with the cathode voltage turned on. Suitably, the bath anode consists of nickel or graphite or platinum; the bath is maintained at room temperature; and the plating voltage is within the range of about 4 to 14 volts. Plating the niobium stannide article under these conditions for a period of about 15 to 30 seconds is sufficient to deposit a thin nickel film on the niobium stannide surface of the article. The nickel film thus deposited exhibits good adhesion to the niobium stannide surface, and makes a good electrical contact thereto. Now electrical lead wires are readily and conveniently bonded to the article by soldering the lead wires to the adherent nickel film. By varying the volumes of the concentrated aqueous metal salt solution, the concentrated aqueous hydrofluoric acid solution, and the water-miscible organic solvent, the concentration of nickel ions in the bath may be varied from about ⅓ to 1½ mols per liter, and the concentration of hydrofluoric acid in the bath may be varied from about 2 to 4½ mols per liter, while maintaining at least 50 volume percent of the organic solvent in the bath.

*Example II*

In this example, the aqueous acid solution consists of concentrated hydrofluoric acid as in Example I, but the metal ions utilized are cobalt ions. A concentrated aqueous solution of cobalt fluoborate is prepared. One volume of the aqueous fluoborate solution is mixed with one volume of the aqueous hydrofluoric acid solution and two volumes of an organic water-miscible solvent, which, in this example, consists of isopropanol. The bath thus contains 50 volume percent of the organic solvent. The concentration of the acid solution and of the metal salt solution is adjusted so that the bath contains about 2 mols hydrofluoric acid per liter and one mol of the cobalt ions per liter.

The niobium stannide article to be plated is degreased, cleaned, washed in water, dipped in aqueous hydrofluoric acid solution, then immersed in the plating bath with the voltage on. A thin adherent film of cobalt is deposited on the niobium stannide surface of the article. The cobalt film thus deposited exhibits good adhesion to the niobium tin surface, and makes a good electrical contact thereto. The desired thickness of the cobalt film is obtained by controlling the plating voltage and the bath temperature and the period of time in the bath. Electrical lead wires are now bonded to the article by soldering the lead wires to the adherent cobalt film.

*Example III*

In this embodiment, the metal ions utilized are those of iron. A concentrated aqueous solution of an iron salt such as iron fluoborate is prepared. A concentrated aqueous solution of hydrofluoric acid is also utilized. The plating bath consists of one volume of the aqueous iron fluoborate solution mixed with one volume of the aqueous hydrofluoric acid solution, and three volumes of an oxygen-containing water-miscible organic solvent. In this example, the organic solvent consists of ethylene glycol. The concentration of the organic solvent in the bath is thus 60 volume percent. The concentration of the aqueous metal salt solution is adjusted so that the concentration of iron in the bath is about ⅓ to 1½ mols per liter, and the concentration of hydrofluoric acid in the bath is about 2 to 4½ mols per liter.

The remaining steps of degreasing and cleaning the niobium stannide article, dipping the article in hydrofluoric acid solution, and immersing the article in the plating bath with the voltage on, are similar to those described above in Example I. A thin adherent film of iron is thus deposited on the niobium stannide surface of the article. The iron film thus plated exhibits good adhesion to the niobium tin surface, and makes a good electrical contact thereto. Electrical lead wires are now bonded to the article by soldering the lead wires to the adherent wire film.

While small amounts of various organic compounds have been added to aqueous plating baths according to the prior art for the purpose of brightening the deposited metal, the amount of such additives has always been of the order of a few volume percent. Applicant has unexpectedly discovered that by utilizing a plating bath which includes a water-miscible oxygen-containing organic solvent in the amount of at least 50 volume percent, the adherence of the deposit to a niobium stannide surface is greatly improved.

The above examples are by way of illustration only, and not limitation. Other oxygen-containing water-miscible organic solvents may be utilized in the plating bath. Various changes and modifications may be made by those skilled in the art without departing from the spirit and scope of the invention as set forth in the specification and appended claims.

What is claimed is:

1. The method of depositing an adherent metallic film on an article having a niobium stannide surface, comprising electroplating said article in a plating bath consisting essentially of (a) a metal salt selected from the group consisting of iron fluoborate, cobalt fluoborate, and nickel fluoborate; (b) hydrofluoric acid; and, (c) a water-miscible organic solvent selected from the group consisting of methanol, ethanol, propanol, isopropanol, ethylene glycol, diethylene glycol, dimethyl formamide glycerine, ethanol 2-methoxy-glycol monomethyl ether, ethanol 2-ethoxy-glycol monoethyl ether, ethanol 2-butoxy-glycol monobutyl ether, and diethylene glycol monoethyl ether, the volume of said solvent being at least 50% of the volume of said bath.

2. The method of forming an electrical connection to an article having a niobuim stannide surface, comprising electroplating said article in a plating bath consisting essentially of nickel fluoborate, hydrofluoric acid, and at least 50 volume percent of a water-miscible organic solvent selected from the group consisting of methanol, ethanol, propanol, isopropanol, ethylene glycol, diethylene glycol, dimethyl formamide, glycerine, ethanol 2-methoxy-glycol monomethyl ether, ethanol 2-ethoxy-glycol monoethyl ether, ethanol 2-butoxy-glycol monobutyl ether, and diethylene glycol monoethyl ether; and bonding an electrical lead wire to said film.

References Cited

UNITED STATES PATENTS

| | | | |
|---|---|---|---|
| 3,207,838 | 9/1965 | McCormack | 29—492 X |
| 3,220,940 | 11/1965 | Brown | 204—49 |

WILLIAM I. BROOKS, *Primary Examiner.*

JOHN F. CAMPBELL, *Examiner.*